United States Patent [19]

Kometani

[11] Patent Number: 5,728,506
[45] Date of Patent: Mar. 17, 1998

[54] LITHOGRAPHIC PROCESSES EMPLOYING RADIATION SENSITIVE POLYMERS AND PHOTOSENSITIVE ACID GENERATORS

[75] Inventor: Janet Mihoko Kometani, Warren, N.J.

[73] Assignee: Lucent Technologies Inc., Murray Hill, N.J.

[21] Appl. No.: 614,926

[22] Filed: Mar. 11, 1996

Related U.S. Application Data

[63] Continuation of Ser. No. 187,373, Jan. 27, 1994, abandoned, which is a continuation of Ser. No. 806,971, Dec. 12, 1991, abandoned.

[51] Int. Cl.$^6$ .................... G03C 5/16; G03C 1/492
[52] U.S. Cl. ................. 430/311; 430/325; 430/326; 430/919; 430/921; 430/270.1
[58] Field of Search ..................... 430/270.1, 311, 430/325, 326, 919, 921

[56] References Cited

U.S. PATENT DOCUMENTS

| | | | |
|---|---|---|---|
| 4,965,340 | 10/1990 | Matsuda | 528/382 |
| 4,996,136 | 2/1991 | Houlihan et al. | 430/313 |
| 5,066,566 | 11/1991 | Novembre | 430/296 |
| 5,135,838 | 8/1992 | Houlihan et al. | 430/326 |
| 5,385,809 | 1/1995 | Bohrer | 430/270 X |

FOREIGN PATENT DOCUMENTS

| | | |
|---|---|---|
| A-0-330386 | 8/1989 | European Pat. Off. |
| A-3 235108 | 4/1983 | Germany. |
| 60-254129 | 12/1985 | Japan. |

OTHER PUBLICATIONS

Fujitsu, K.K., et al, "Formation of Pattern", *Patent Abstracts of Japan*, vol. 10, No. 132 (P-456) (2189), May 16, 1986.
*Journal of Vacuum Science and Technology*, 12, No. 6, 1317, 1975, B.J. Lin.
*Advances in Macromolecular Chemistry*, 7, 335, 1968, K.J. Ivin and J.B. Rose.

*Primary Examiner*—George F. Lesmes
*Assistant Examiner*—Bernard P. Codd
*Attorney, Agent, or Firm*—Richard J. Botos

[57] ABSTRACT

The use of a terpolymer significantly enhances the properties of resists suitable for deep UV lithography in the manufacture of semiconductor devices. This terpolymer is one represented by the polymer formed from sulfur dioxide, an acid-sensitive monomer moiety and a monomer that imparts polarity to the final terpolymer.

12 Claims, No Drawings

LITHOGRAPHIC PROCESSES EMPLOYING RADIATION SENSITIVE POLYMERS AND PHOTOSENSITIVE ACID GENERATORS

This application is a continuation of application Ser. No. 08/187373, filed on Jan. 27, 1994, now abandoned, which was a continuation of Ser. No. 07/806971 filed Dec. 12, 1991, now abandoned.

BACKGROUND OF THE INVENTION

1. Field of the Invention

This invention relates to lithographic processes, and, in particular, to lithographic processes involving device fabrication.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing light is coated onto a substrate, e.g., a silicon wafer, that is being processed to form a plurality of devices. The coating material, i.e., the resist is then subjected to light that has been passed through a mask material so that the light reaching the resist corresponds to a desired pattern that is to be transferred into the underlying substrate. Since the exposure occurs simultaneously over an entire device or a number of devices being processed on a substrate, e.g., a silicon substrate, the procedure is considered a blanket exposure.

A blanket exposure procedure is advantageous because it is relatively fast compared to other methods such as the raster scan technique usually employed when the energy used to expose the resist is a beam of electrons. However, generally, resolution obtainable through a blanket exposure with ultraviolet or visible light is poorer than that achieved with other methods such as electron lithography.

One resist material, poly(methyl methacrylate) (PMMA) upon exposure with ultraviolet actinic radiation has shown resolution better than that achieved with exemplary resists used at conventional wavelengths (greater than 300 nm). For example, PMMA has been shown to be capable of resolution as good as about 250 nm. (See B. J. Lin, *Journal of Vacuum Science and Technology*, 12, 1317 (1975).) Although PMMA exhibits excellent resolution, its sensitivity to practical sources of actinic radiation is quite limited. Therefore, exposure times are generally excessive for practical applications. Additionally, the plasma etch resistance of PMMA is poor and thus pattern transfer to the substrate is not entirely optimal.

Another suggested photoresist employs a compound that produces an acid moiety upon deep UV irradiation and a polymer that is altered upon reaction with the generated acid in a catalytic manner, to produce acidic substituents. Typical acid generator/acid sensitive polymer combinations include an onium salt as the photosensitive acid generator and a polymer such as poly(p-t-butoxycarbonyloxystyrene) (BOCS) as the polymer having a reactive substituent.

Other photosensitive systems responsive to deep UV light have also been proposed. For example, as described in U.S. Pat. No. 4,996,136 dated Feb. 26, 1991 (which is hereby incorporated by reference), an advantageous resist material that has excellent sensitivity to deep UV irradiation is formed from a polymer including a chain scission moiety such as a sulfone unit and a substituent that undergoes a reaction to form an acidic moiety when subjected to a photogenerated species. Exemplary compounds include poly(t-butoxycarbonyloxystyrene-sulfone) which is sensitive to a photogenerated species (e.g. acid) and 2,6-dinitrobenzyl p-toluenesulfonate, which is responsible for the photogenerated species. The sulfonate ester decomposes to form the parent sulfonic acid upon irradiation and this acid reacts catalytically with the t-butoxycarbonyl group to form an acidic functionality.

Although sulfone-containing polymers for deep UV exposures have significantly improved the sensitivity of such materials, and indeed have excellent properties, the adhesion of these materials to device substrates (substrates having semiconductor, insulator, and/or metallic regions) could be advantageously improved. Additionally, such materials have a tendency to lose thickness upon irradiation associated with the loss of a moiety upon reaction with the photogenerated species. Reduction of this thickness loss would provide enhanced resolution, improved adhesion, and improved resistance to plasma etching.

SUMMARY OF THE INVENTION

The present invention provides a process for manufacturing a device comprising the steps of 1) forming a radiation sensitive composition on a substrate, 2) exposing the composition to radiation to form a latent image, 3) developing the image in the composition to form a developed image by subjecting the composition to a solvent, and 4) using the developed image in subsequent processing of the substrate. The radiation sensitive composition comprises a polymer and a photosensitive acid generator. The polymer comprises the reaction product of A) $SO_2$, B) a polar monomer having a polarity of at least 1.5 Debye and a solubility in water of pH 7 of at least 0.5 gms. per 100 gms. of water, and C) a monomer having a substituent that reacts with an acid generated by interaction of the photosensitive acid generator with the radiation. A polymer reaction product is formed having different solubility in the solvent than a region of the radiation sensitive composition lacking exposure to the radiation.

Substantial reduction in thickness loss upon irradiation and post-exposure bake of a deep UV resist and, with appropriate choice of substituents, enhanced adhesion are achieved by employing a specific polymer in a resist. This polymer is represented by a material formed by the interaction of at least three monomers (although the polymers will be described in terms of their formation from three or more monomers, the specific class of polymers are useful irrespective of the mode of formation or the reactants employed to produce them.) The three monomer units should include 1) sulfur dioxide, which gives rise to a sulfone group in the polymer backbone, 2) a monomer that includes a moiety that reacts with a photogenerated species, e.g., a t-butoxycarbonyloxy group that reacts with acid, and 3) a monomer that includes a polar moiety that enhances the solubility of the polymeric material produced by reaction between the photogenerated species and the polymeric species-sensitive moiety of (2). Typical compounds within this class of materials are terpolymers prepared from t-butoxycarbonyloxystyrene, acetoxy or methoxystyrene, and sulfur dioxide, where the t-butoxycarbonyloxystyrene monomer provides the acid sensitive group and an acetoxy or methoxystyrene monomer provides the polar group.

Although the materials of this invention are primarily formulated to be used as a reactant with a radiation generated species, they are not precluded as a matrix material in a solubility inhibited system. That is, the polymers of this invention, with the component (2) monomer having its species sensitive substituent replaced by a developer soluble moiety are soluble in the developer, but when suitable developer insoluble materials are added, become insoluble. The photo decomposition of the developer insoluble material returns the matrix to its original solubility and thus allows selective removal of the matrix material.

DETAILED DESCRIPTION

As previously discussed, in one embodiment of the invention the resist material upon exposure generates a material that reacts with the base polymer, e.g., with the terpolymer. Through this reaction the exposed material relative to the unexposed material has a different acidity and a somewhat different molecular weight. By utilizing this difference it is possible to employ the resist both as a negative and positive resist. In the latter case, the exposed region is removed by utilizing a solvent for the exposed region. In the former case, the unexposed region is removed by utilizing a suitable solvent. In either case, if the ratio of the rate of dissolution of the photosensitive composition before irradiation compared to that after irradiation is taken as 1:n, n should not be less than 2 and preferably should be more than 10 for a positive image (less than 0.5 for a negative image). Relative solubility ratios with values of n<2 (>0.5 for negative images), typically produce low contrast and inferior image quality. Generally, if a negative image is desired, a solvent is employed that does not induce excessive swelling of exposed regions. Similarly, if a positive image is desired, a solvent is chosen to avoid excessive swelling in the unexposed regions. The solution rate of the material (denominated the base polymer) sensitive to the radiation generated species depends on the concentration of the base polymer in the resist and the number of radiation generated species-sensitive moieties as well as polar moieties. Typically, to maintain a suitable difference in solubility between the exposed and unexposed regions, it is desirable that the species-sensitive monomers to the polar monomer in the polymer have a mole ratio in the range 2.3 to 0.5 and that the mole ratio between 1) the sum of the species sensitive monomer plus the polar monomer in the polymer and 2) the $SO_2$ is in the range 1.5 to 4, preferably 1.5 to 3. For less of the $SO_2$, solubility such as aqueous base solubility is lowered; for more of the species sensitive moiety there is a tendency for unacceptable film thickness loss to occur and for decreased substrate adhesion; for more of the polar monomer dissolution in the developer is substantially inhibited; while for more of the $SO_2$, synthesis of the polymer becomes difficult. The degree of polarity and the concentration of the polar moiety depends on the specific species-sensitive moiety employed. Generally, for typical species-sensitive monomers such as t-butoxycarbonyloxystyrene and a polar monomer such as acetoxystyrene, the previously discussed ratios generally are employed. The specific concentration of the polar moiety for a specific species-sensitive moiety is easily determined through use of a control sample. A variety of substituents are available to yield the desired reactivity with a radiation generated species such as a radiation generated acid. Substituents such as t-butyl, t-butoxycarbonyl, t-amyloxycarbonyl are representative of suitable substituents. In one embodiment, these substituents are chosen to produce in the presence of an acid, a carbonium ion that is sufficiently stable to allow the elimination of an available α-hydrogen. These substituents are used in the monomer such that a portion of the monomer reacts with $SO_2$ and the polar monomer to form a polymer. However, substituents on any of the monomers which 1) interfere with the desired radiation generation of a species and subsequent desired reactions or 2) which cause undesirable instability of the polymer should be avoided.

A variety of substituents are also available to yield the desired polarity for the polar monomer, i.e. a monomer having a dipole moment of greater than or equal to 1.5 Debye and a water solubility (pH=7.0) of at least 0.5 gms. per 100 gms. of water. Examples of such substituents are acetoxy, methoxy and hydroxy. These substituents are chosen to provide improved adhesion and, through reduction of the species sensitive moiety, reduced thickness loss. Similarly, this substituent is employed on a monomer which reacts with $SO_2$ and the species sensitive monomer. Functional groups for such monomers that react with each other and with $SO_2$ well known and described in compendiums such as K. J. Ivin and J. B. Rose, *Advances in Macromolecular Chemistry*, 7, 335 (1968).

The polymer produced should preferably have a glass transition temperature, $T_g$, that is higher than 30° C., preferably higher than 50° C. If the $T_g$ is substantially lower than the given limit, there is a tendency for the resist to flow during subsequent processing, thus degrading image quality. Generally, with monomers such as substituted styrenes, suitable $T_g$'s are obtained. Additionally, the material should form a continuous pinhole-free coating, on the substrate to be treated for suitable coating techniques. For example, in the case of a silicon-based substrate, such as a processed silicon device wafer, the subject polymers form excellent coatings. Typically, the thickness of the polymer coating utilized is in the range of 0.2 µm to 2.0 µm, preferably 0.3 µm to 1.0 µm. Thinner coatings are difficult to maintain pinhole free. Additionally, in thicker coatings the resolution is generally inferior since the delineation of narrow features results in the production of narrow columns in the developed pattern that tend to deform. Thicker layers also lead to greater absorption with a resulting degradation in image quality. The quality of the coating is also enhanced by improved adhesion to the substrate. Generally, such improvement is obtained relative to a co-polymer by introduction of a polar substituent. The corresponding monomer should generally have a dipole moment greater than or equal to 1.5 Debye and a water (pH=7.0) solubility greater than 0.5 gms. per 100 gms. of water. For ease of determination, the solubility required in the case of styrene based monomers should be considered satisfied if the corresponding substituted benzene (the styrene having the vinyl group removed) has a solubility greater than 1 gm. per 100 gms. of water. For oxygen containing monomers, the oxygen to carbon atomic ratio of the polar substituent should be at least 1.0. However, presence of other hetero-atoms is not precluded provided the previously discussed water solubilities are satisfied. This same polar substituent is useful to enhance adhesion and reduce thickness loss. (Use of more than one polar moiety is not precluded.)

An appropriate optical density in the wavelength range to be used for exposure significantly enhances resist quality. Too low an optical density results in inefficient absorption of the exposing radiation and in unnecessarily long exposure times. Too high an optical density does not permit sufficient light to reach the regions of the polymer film furthest removed from its ambient/polymer film interface. This incomplete exposure tends to degrade resist image quality. In general, it is desirable to employ an optical density for the entire resist that is preferably less than 0.5 for at least 30 percent of the actinic radiation that reaches the polymer at the exposure wavelength. Additionally, at least 40% of the absorbed exposure radiation should be absorbed by the species generator.

The optical density depends on the concentration of the absorbing species in both the polymer and the acid generator. Thus, once a suitable thickness for the resist material coating is chosen, the resist composition is adjusted to provide the desired optical density. For thicknesses as previously discussed in connection with film continuity, if the desired optical density is maintained, useful results are attained.

It is generally desirable to employ polymers having molecular weights in the range 30,000 to 300,000. Molecular weights greater than 300,000 are undesirable because solubility and resolution is degraded, while molecular weights less than 30,000 are not suitable because coating quality is substantially degraded. The molecular weight is determined by the polymerization reaction conditions such as the initiator, the reaction temperature, and the monomer concentration. These parameters are interrelated and a control sample is utilized to determine the specific conditions necessary to yield the desired molecular weight. However, generally for molecular weights in the desired range, the polymers are produced by free radical solution polymerization, employing temperatures of 50° to 70° C., an initiator such as azo-bis-isobutyronitrile, and stoichiometrics in the range 1:33 to 1:100 mole ratio initiator to total monomer.

Photogeneration of species such as acids suitable for use in the inventive resists include those described in U.S. Pat. No. 4,996,136 as well as U.S. Pat. No. 5,135,856, which are hereby incorporated by reference. Additionally, processing conditions for coating the resist material onto a device substrate and subsequent exposure are also described in U.S. Pat. No. 4,996,136 patent. For use in the inventive procedure, a material that undergoes a conversion into an acidic entity upon irradiation with electromagnetic radiation in the wavelength range 220 to 300 nm is utilized in conjunction with a suitable polymer. For example, onium salts, such as described in U.S. Pat. No. 4,491,628 dated Jan. 1, 1985 which is hereby incorporated by reference, are useful. However, it has been found that nonionic molecules have less tendency to separate from the polymer in the resist composition and are less likely to produce undesirable properties in the substrate to be processed. An advantageous class of materials that undergoes conversion to an acid upon irradiation is represented by the formula

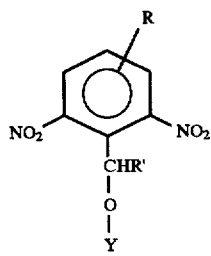

where R is not critical provided it is neither acidic nor absorbs sufficient UV exposing light to substantially decrease sensitivity. Exemplary substituents for R are H, lower alkyl and halogen (all R's need not be the same). R' is advantageously H or $CH_3$, while Y is preferably

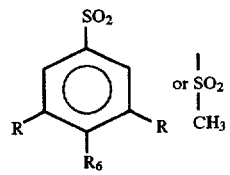

(with R as defined above and $R_6$ is H, lower alkoxy, fluorine, chlorine, $NO_2$, nitrile, acetoxy, or lower alkyl such as $CH_3$). The particular moiety used for Y is not critical provided it requires a temperature of at least 75° C. to cause splitting of the Y moiety from the remainder of the acid generator. This material, upon irradiation, produces a sulfonic acid and a nitroso-bezaldehyde or a related structure. The resulting sulfonic acid then reacts with substituents on the polymer to produce a polymer having acidic functionalities. For such molecules, it is possible to further substitute on the aromatic rings. However, substituents that are acidic should be avoided because the polymer will degrade prior to usage. A particularly effective material is 2,6-dinitrobenzyl-p-toluene sulfonate. It is desirable after coating that the material be prebaked at a temperature in the range 90° to 120° C. After exposure, baking in the range 90 to 135° C. is also desirable. Typical deep ultraviolet doses used for producing resolutions in the range 0.25 to 2.0 µm are those in the range 20 to 100 mjoules/$cm^2$. Solvents suitable for developing the exposed image are materials such as aqueous tetramethylammonium hydroxide. Generally, immersion in the developer for time periods from 1.0 to 5.0 minutes produces the desired delineation. The developed resist is then employed in subsequent processing, e.g. etching, of the device substrate.

The following examples are illustrative of the conditions employed to synthesize and delineate patterns in materials involved in the invention.

EXAMPLE 1

Polymerization was performed in a thick-wall Kjeldahl flask modified with stopcocks suitable for vacuum manipulation and transfer of reactants. Freshly distilled 4-acetoxystyrene (AS) (20 gms., 0.12 moles including 25 parts by million of phenothiazine inhibitor, the mixture distilled under vacuum at 75° C., 0.05 Torr) and degassed 4-t-butoxycarbonyloxystyrene (TBS) (27 gms., 0.12 moles used as obtained from Kodak Specialty Chemicals) was transferred under vacuum into the reactor. The reactor was then placed in a −75° C. bath. A mixture of azo-bis-isobutyronitrile (AIBN) (0.81 gms., 0.005 moles obtained from Alpha Chemical Company) and 10 mL of toluene was transferred by syringe into the reaction medium through an injection port. The injection port was then washed with an additional 15 mL of toluene.

Sulfur dioxide was passed through a column of phosphorus pentoxide, condensed through the vacuum line into a graduated flask, degassed by 2 to 4 cycles of sequentially freezing and thawing using 77° K. for the freeze step and the ambient temperature for the thaw step and then distilled under vacuum into the graduated flask. After sulfur dioxide (0.55 moles, 22 mL at −75° C.) was distilled into the reactor, the reactor was sealed and placed into a 65° C. bath. The reactor was maintained in this bath for 4 hours and then quenched by cooling to 0° C. with the addition of approximately 100 mL of acetone.

The resulting terpolymer was precipitated from the reaction medium by adding this medium dropwise into a mixture of 2 liters of isopropanol with 2 liters of methanol. The polymer was redissolved and precipitated two more times by dissolution in acetone and reprecipitated from a one to one (volume-to-volume), mixture of isopropanol and methanol. The precipitated polymer was then dried in a vacuum oven at room temperature. The yield was approximately 60%.

EXAMPLE 2

A variety of polymers were synthesized according to the procedure of Example 1 utilizing the reactants, reactant ratios, and reaction conditions shown in Table 1. Reaction 1 represents copolymers of AS and TBS. Reactions 2, 3, and 5–8 represent terpolymers of AS, TBS, and sulfur dioxide and Reaction 4 represents a copolymer of AS and $SO_2(S)$.

EXAMPLE 3

Approximately 1.59 gms. of bis-(2-nitro-6-trifluoromethylbenzyl)-1,3-disulfonate was dissolved in 50 mL of ethyl-3-ethoxypropionate. Then approximately 10 gms. of polymer whose preparation is described in Example 1 was further dissolved in this solution. The resulting solution was filtered three times through a stack of filters having from input to output, filters with pore sizes of respectively, 1 micron, 0.5 microns, and 0.2 microns. Approximately 5 mL of the filtered solution was placed in approximately the center of a 5 inch silicon wafer that had previously been treated with the adhesion promoter hexamethyldisilazane. The resist was spun at a speed of approximately 4,000 rpm for approximately 1 minute to yield a resist coating having a thickness of approximately 0.8 μm. The coated substrate was placed on a vacuum sample holder of a hot plate on an SVG System 88 wafer track and heated to a temperature of approximately 105° C. where it was maintained for approximately 1 minute. The wafer was transferred to the sample holder of a 0.35 NA GCA Laser-Step® lithographic tool having a 248 nm excimer KrF laser exposure source. The wafer was exposed in a resolution test pattern having features 0.3 to 2.0 μm over a 7 mm square exposure field with a dose of approximately 60 mjoules per centimeter squared. The wafer was then post-exposure baked on an SSI System 150 wafer track at a temperature of approximately 115° C. for 1 minute utilizing a vacuum hold down sample holder. The resulting thickness loss in the exposed regions was 18%. The solution was immersed for 2 minutes in a 0.5N aqueous solution of tetramethylammonium hydroxide. The wafer was then rinsed for 30 seconds in deionized water and spun dry. Features down to 0.3 μm were resolved.

EXAMPLE 4

The procedures of Example 3 were followed with the polymers denominated 2–8 in Table 1. Table 2 shows the results of these exposures and thickness loss upon post-exposure bake.

EXAMPLE 5

The procedure of Example 3 was followed except approximately 10 gms. of the copolymer denominated number 1 in Table 1 was employed. After post-exposure bake, a thickness loss of approximately 20% was obtained, and after immersion in the developer, no features were resolved. Substitution of isopropanol for the tetramethylammonium hydroxide did not improve the resolution.

TABLE 1

| | Composition Mole % | | Mole Composition Final Polymer Styrene | Feed Mole Ratio | AIBN to Total Styrene Monomer | | | | |
|---|---|---|---|---|---|---|---|---|---|
| | AS | TBS | $SO_2$ | $AS/TBS/SO_2$ | Mole Ratio | Solvent | Reaction Temp | Molecular Weight | Reaction Time |
| 1 P(AS/TBS) | 55% | 45% | — | 71:29:0 | 1:50 | Toluene | 65° C. | 140,000 | 2 hrs |
| 2 50/50 Bulk P(AS/TBS/S) | 53% | 47% | 2.6:1 | 1:1:4.5 | 1:50 | Bulk | 65° C. | 185,000 | 1½ hrs |
| 3 50/50 P(AS/TBS/S) | 50% | 50% | 2.4:1 | 1:1:4.5 | 1:50 | Toluene | 55° C. | 198,000 | 4 hrs |
| 4 100 P(AS/S) | 100% | 0 | 2.75:1 | 1:0:2.5 | 1:50 | Toluene | 65° C. | 87,000 | 4 hrs |
| 5 40/60 P(AS/TBS/S) | 40% | 60% | 2.8:1 | 4:6:25 | 1:50 | Toluene | 65° C. | 104,500 | 4 hrs |
| 6 30/70 P(AS/TBS/S) | 30% | 70% | 3:1 | 3:7:25 | 1:50 | Toluene | 65° C. | 104,600 | 4 hrs |
| 7 60/40 P(AS/TBS/S) | 60% | 40% | 2.85:1 | 6:4:25 | 1:50 | Toluene | 63° C. | 114,000 | 4 hrs |
| 8 methoxy P(MS/TBS/S) | 50% | 50% | 2.35:1 | 1:1:5 | 1:50 | Toluene | 55° C. | 134,000 | 4 hrs 15 min |

TABLE 2

| Polymer | Volume Loss Upon Post Exposure Bake (%) | Exposure Dose (mJ/cm$^2$) | Resolution (μm) |
|---|---|---|---|
| 2 | 18 | 60 | 0.3 |
| 3 | 18 | 60 | 0.3 |
| 4 | none | no image | no image |
| 5 | 20 | 50 | 0.3 |
| 6 | 24 | 45 | 0.3 |
| 7 | 15 | 110 | 0.4 |
| 8 | 19 | 100 | 0.35 |

I claim:

1. A process for manufacturing a device comprising the steps of 1) forming a radiation sensitive composition on a substrate, 2) exposing said composition to radiation to form a latent image, 3) developing said image in said composition to form a developed image by subjecting said composition to a solvent, and 4) using said developed image in subsequent processing of said substrate characterized in that said radiation sensitive composition comprises a polymer and a photosensitive acid generator, said polymer comprising the reaction product of A) SO₂,B) a polar monomer having a polarity of at least 1.5 Debye and a solubility in water of pH 7 of at least 0.5 gms. per 100 gms. of water, and C) a monomer having a substituent that reacts with an acid generated by interaction of said photosensitive acid generator with said radiation to form a polymer reaction product having different solubility in said solvent than a region of said radiation sensitive composition lacking exposure to said radiation.

2. The process of claim 1 wherein said monomer B) comprises a monomer having a functional group chosen from the class consisting of acetoxy, methoxy and hydroxy.

3. The process of claim 2 wherein said monomer B) comprises acetoxystyrene, methoxystyrene, or hydroxystyrene.

4. The process of claim 1 wherein said monomer C) substituent comprises t-butoxycarbonyloxy.

5. The process of claim 4 wherein said monomer C) comprises t-butoxycarbonyloxystyrene.

6. The process of claim 1 wherein said photosensitive acid generator comprises a material represented by the formula

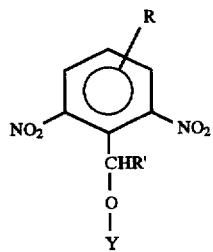

where R is not acidic, R' comprises a member of the group consisting of H and CH₃ and Y is chosen so that it requires a temperature of at least 75° C. to cause its removal from the remainder of said photosensitive acid generator.

7. The process of claim 6 where Y is chosen from the group consisting of

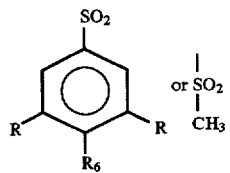

where R is not acidic and R₆ comprises a member of the group consisting of lower alkoxy, fluorine, chlorine, NO₂, nitrile, acetoxy, and lower alkyl.

8. A process for manufacturing a device comprising the steps of 1) forming a radiation sensitive composition on a substrate, 2) exposing said composition to radiation to form a latent image, 3) developing said image in said composition to form a developed image by subjecting said composition to a solvent, and 4) using said developed image in subsequent processing of said substrate characterized in that said radiation sensitive composition comprises a polymer, said polymer comprising the reaction product of A) SO₂,B) a polar monomer having a polarity of at least 1.5 Debye and a solubility in water of pH 7 of at least 0.5 gms. per 100 gms. of water, and C) a monomer having a substituent that reacts with an acid generated by interaction of radiation with said composition, wherein reaction of said radiation sensitive composition with radiation forms a polymer reaction product having different solubility in said solvent than a region of said radiation sensitive composition lacking exposure to said radiation.

9. The process of claim 8 wherein said monomer B) comprises a monomer having a functional group chosen from the class consisting of acetoxy, methoxy, and hydroxy.

10. The process of claim 9 wherein said monomer B) comprises acetoxystyrene, methoxystyrene, or hydroxystyrene.

11. The process of claim 8 wherein said monomer C) substituent comprises t-butoxycarbonyloxy.

12. The process of claim 11 wherein said monomer C) comprises t-butoxycarbonyloxystyrene.

* * * * *